United States Patent
Min

(10) Patent No.: US 9,681,567 B2
(45) Date of Patent: Jun. 13, 2017

(54) DISPLAY DEVICE

(71) Applicant: Samsung Display Co., Ltd., Yongin, Gyeonggi-Do (KR)

(72) Inventor: Gui-Nam Min, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 200 days.

(21) Appl. No.: 14/142,787

(22) Filed: Dec. 28, 2013

(65) Prior Publication Data

US 2015/0009632 A1 Jan. 8, 2015

(30) Foreign Application Priority Data

Jul. 3, 2013 (KR) .................. 10-2013-0078003

(51) Int. Cl.
*H05K 7/02* (2006.01)
*G02F 1/1333* (2006.01)
*G06F 1/16* (2006.01)
*C09J 7/02* (2006.01)

(52) U.S. Cl.
CPC .............. *H05K 7/02* (2013.01); *C09J 7/0246* (2013.01); *G02F 1/133305* (2013.01); *G06F 1/1652* (2013.01); *G02F 2001/133331* (2013.01); *G02F 2202/28* (2013.01)

(58) Field of Classification Search
CPC ........ C09J 7/0246; H05K 7/02; G06F 1/1652; G02F 1/133305; G02F 2202/28; G02F 2001/133331
See application file for complete search history.

(56) References Cited

U.S. PATENT DOCUMENTS

| | | | | |
|---|---|---|---|---|
| 4,177,553 A | * | 12/1979 | Klein | .................. H05K 1/0353 |
| | | | | 156/148 |
| 4,501,787 A | * | 2/1985 | Marchetti | ............... B32B 15/08 |
| | | | | 174/259 |
| 4,513,055 A | * | 4/1985 | Leibowitz | ............ H05K 1/0366 |
| | | | | 174/256 |

(Continued)

FOREIGN PATENT DOCUMENTS

EP 2341112 A1 7/2011
KR 1020030070555 A 8/2003

(Continued)

OTHER PUBLICATIONS

P. Potiyaraj et. al.,,Physical properties of Unsaturated Polyester Resin from Glycolyzed PET Fabrics, Nov. 11, 2006, Journal of Applied PolymerScience, vol. 104, pp. 2536-2541.*

(Continued)

*Primary Examiner* — David M Sinclair
*Assistant Examiner* — Theron S Milliser
(74) *Attorney, Agent, or Firm* — Cantor Colburn LLP

(57) ABSTRACT

A display device includes: a display module; a window disposed on the display module; and an adhesive layer disposed between the display module and the window, where the adhesive layer includes a pressure sensitive adhesive including an impregnation region impregnated with a fiber, and a density of the fiber in the adhesive layer is predetermined based on a position thereof in the impregnation region or a part of the display device corresponding thereto.

18 Claims, 8 Drawing Sheets

(56) References Cited

U.S. PATENT DOCUMENTS

| | | | | |
|---|---|---|---|---|
| 4,609,586 A * | 9/1986 | Jensen | H05K 1/056 | 428/209 |
| 4,707,565 A * | 11/1987 | Kasai | H05K 1/0366 | 174/255 |
| 4,812,355 A * | 3/1989 | Yokoyama | B32B 15/14 | 428/215 |
| 4,814,945 A * | 3/1989 | Leibowitz | H05K 1/0366 | 174/256 |
| 4,943,334 A * | 7/1990 | Medney | B29C 53/564 | 156/169 |
| 5,037,691 A * | 8/1991 | Medney | B29C 53/564 | 361/748 |
| 5,206,078 A * | 4/1993 | Inoguchi | D03D 1/0082 | 139/420 A |
| 5,269,863 A * | 12/1993 | Middelman | B29C 70/16 | 156/176 |
| 5,284,891 A * | 2/1994 | Wouters | C08F 240/00 | 524/522 |
| 5,592,737 A * | 1/1997 | Middelman | B32B 37/12 | 156/233 |
| 5,639,530 A * | 6/1997 | Miron | B63C 9/20 | 359/515 |
| 5,868,892 A * | 2/1999 | Klima, Jr. | B32B 38/10 | 156/256 |
| 6,283,166 B1 * | 9/2001 | Miyasato | D03D 15/0011 | 139/383 R |
| 6,333,736 B1 * | 12/2001 | Sandbach | G06F 3/0414 | 178/18.03 |
| 6,483,498 B1 * | 11/2002 | Colgan | G06F 3/045 | 178/18.05 |
| 6,490,402 B1 * | 12/2002 | Ota | D02G 3/441 | 257/E25.02 |
| 7,278,586 B2 * | 10/2007 | Takahashi | G06K 19/14 | 235/454 |
| 7,324,093 B1 * | 1/2008 | Gettemy | G06F 1/1622 | 178/18.01 |
| 7,561,052 B2 * | 7/2009 | Arai | G06K 19/07722 | 235/487 |
| 7,867,610 B2 * | 1/2011 | Takahashi | C09J 7/0217 | 428/214 |
| 8,208,262 B2 * | 6/2012 | Sakurai | G06K 19/07703 | 361/737 |
| 8,501,640 B2 * | 8/2013 | Suzuki | C09J 7/045 | 428/343 |
| 8,508,495 B2 * | 8/2013 | Hotelling | G06F 3/0412 | 345/173 |
| 2002/0076522 A1 * | 6/2002 | Hsieh | B29C 70/083 | 428/113 |
| 2002/0127379 A1 * | 9/2002 | Suzuki | H05K 1/0366 | 428/209 |
| 2002/0157859 A1 * | 10/2002 | Vasoya | B32B 5/26 | 174/250 |
| 2003/0026967 A1 * | 2/2003 | Joseph | D01F 6/52 | 428/292.1 |
| 2004/0180593 A1 * | 9/2004 | Perillon | D06N 3/06 | 442/43 |
| 2005/0074606 A1 * | 4/2005 | Nishiyama | C09J 7/02 | 428/354 |
| 2005/0081913 A1 * | 4/2005 | Ebbesen | D02G 3/441 | 136/244 |
| 2006/0068613 A1 * | 3/2006 | Tsukada | H05K 1/028 | 439/67 |
| 2006/0072045 A1 * | 4/2006 | Tanabe | G06F 3/045 | 349/12 |
| 2006/0223398 A1 * | 10/2006 | Citterio | F41H 5/0478 | 442/123 |
| 2007/0004125 A1 * | 1/2007 | Watanabe | H01L 21/76882 | 438/239 |
| 2007/0062639 A1 * | 3/2007 | Chang | B32B 37/1292 | 156/291 |
| 2007/0200220 A1 * | 8/2007 | Murai | H01L 23/4985 | 257/701 |
| 2008/0002118 A1 * | 1/2008 | Paek | G02F 1/133305 | 349/122 |
| 2008/0012155 A1 * | 1/2008 | Raravikar | B82Y 10/00 | 257/789 |
| 2008/0043167 A1 * | 2/2008 | Washizawa | G02F 1/133528 | 349/56 |
| 2008/0284971 A1 * | 11/2008 | Park | G02F 1/133305 | 349/158 |
| 2008/0303140 A1 * | 12/2008 | Ohtani | H01L 21/56 | 257/729 |
| 2008/0311706 A1 * | 12/2008 | Dozen | H01L 23/293 | 438/127 |
| 2009/0095521 A1 * | 4/2009 | Yokouchi | H05K 1/0366 | 174/266 |
| 2009/0115942 A1 * | 5/2009 | Watanabe | G02F 1/133305 | 349/96 |
| 2009/0117366 A1 * | 5/2009 | Honma | B29C 70/086 | 428/314.8 |
| 2009/0305467 A1 * | 12/2009 | Goto | H01L 21/561 | 438/125 |
| 2009/0314527 A1 * | 12/2009 | Hatano | G06K 19/07745 | 174/255 |
| 2010/0007829 A1 * | 1/2010 | Oikawa | G02F 1/133305 | 349/122 |
| 2010/0007942 A1 * | 1/2010 | Oikawa | G02F 1/167 | 359/296 |
| 2010/0051327 A1 * | 3/2010 | Ogatsu | H05K 1/0366 | 174/254 |
| 2010/0259910 A1 * | 10/2010 | Hayashi | B32B 5/28 | 361/783 |
| 2011/0108870 A1 * | 5/2011 | Jaeger | H01L 33/483 | 257/98 |
| 2011/0193829 A1 * | 8/2011 | Tsai | G09F 9/30 | 345/204 |
| 2012/0020056 A1 | 1/2012 | Yamagata et al. | | |
| 2012/0081874 A1 | 4/2012 | Wu et al. | | |
| 2013/0034713 A1 | 2/2013 | Busman et al. | | |
| 2013/0043065 A1 * | 2/2013 | Park | B32B 33/00 | 174/254 |
| 2013/0164493 A1 * | 6/2013 | Hirai | G02F 1/133308 | 428/113 |
| 2013/0322035 A1 * | 12/2013 | Hamburgen | B32B 15/012 | 361/752 |
| 2014/0087614 A1 * | 3/2014 | Matsuda | C08J 5/24 | 442/59 |
| 2015/0017417 A1 * | 1/2015 | Min | B32B 7/12 | 428/300.7 |
| 2015/0029652 A1 * | 1/2015 | Min | G06F 1/1652 | 361/679.27 |

FOREIGN PATENT DOCUMENTS

| | | |
|---|---|---|
| KR | 1020050063754 A | 6/2005 |
| KR | 1020110079711 A | 7/2011 |

OTHER PUBLICATIONS

T. Peijs et al., Mechanical properties of poly(vinyl alcohol) fibres and composites, Apr. 12, 1994, Composites, vol. 26, No. 2, pp. 83-90.*

Extended European Search Report dated Oct. 24, 2014.

* cited by examiner

DISPLAY DEVICE

This application claims priority to Korean Patent Application No. 10-2013-0078003, filed on Jul. 3, 2013, and all the benefits accruing therefrom under 35 U.S.C. §119, the content of which in its entirety is herein incorporated by reference.

BACKGROUND

1. Field

Exemplary embodiments of the invention relate to a display device.

2. Description of the Related Art

A display device, such as a liquid crystal display ("LCD"), a plasma display panel ("PDP"), an organic light emitting diode display ("OLED"), a field effect display ("FED") and an electrophoretic display device, for example, typically includes a display module for displaying an image and a window for protecting the display module. The window, which typically defines an outermost surface of the display to protect the display module, may be damaged such that the window may have a spot from a pushed-down pen, a scratch, and the like, for example.

SUMMARY

Exemplary embodiments of the invention relate to a display device, in which a display module thereof is effectively protected, and a compression stress, which may occur when the display device is bent, is substantially reduced by applying various elasticities to parts thereof.

In an exemplary embodiment, a display device includes a display module; a window disposed on the display module; and an adhesive layer disposed between the display module and the window, where the adhesive layer includes a pressure sensitive adhesive including an impregnation region impregnated with a fiber, and a density of the fiber in the adhesive layer is predetermined based on a position thereof in the impregnation region or a part of the display device corresponding thereto.

In an exemplary embodiment, the adhesive layer may have a single layer structure.

In an exemplary embodiment, the fiber may include a glass fiber, a carbon fiber, an aramid-based fiber, a polyester fiber, asbestos, a cellulose-based fiber, or a combination thereof.

In an exemplary embodiment, the fiber may have a fabric type of plain fabrics, twilled fabrics, satin weave fabrics, unidirectional fabrics, or a combination thereof.

In an exemplary embodiment, an amount of the fiber in the pressure sensitive adhesive may be in a range of about 10 wt % to about 90 wt % based on a total amount of the pressure sensitive adhesive.

In an exemplary embodiment, a portion of the impregnation region may include a first impregnation portion and a second impregnation portion, and a density of the fiber in the first impregnation portion may be lower than a density of the fiber in the second impregnation portion.

In an exemplary embodiment, the density of the fiber in the first impregnation portion may be about 0.1 to about 0.9 times the density of the fiber in the second impregnation portion.

In an exemplary embodiment, the first impregnation portion may have a modulus in a range of about 0.001 megapascal (MPa) to about 500 megapascals (Mpa), and the second impregnation portion may have a modulus of about 900 Mpa to about 20,000 Mpa.

In an exemplary embodiment, the display device may further include a folding part which is foldable, and a flat part other, where the first impregnation portion may correspond to the folding part, and the second impregnation portion may correspond to the flat part.

In an exemplary embodiment, the pressure sensitive adhesive may further include a non-impregnation region not impregnated with a fiber.

In an exemplary embodiment, the impregnation region may have a modulus in a range of about 900 MPa to about 20,000 Mpa, and the non-impregnation region may have a modulus in a range of about 0.001 MPa to about 500 Mpa.

In an exemplary embodiment, the display device may further include a folding part which is foldable, and a flat part, where the non-impregnation region may correspond to the folding part, and the impregnation region may correspond to the flat part.

In an exemplary embodiment, the impregnation region may include a plurality of layers.

In an exemplary embodiment, a portion of the impregnation region may include a first layer facing the window, and a second layer facing the display module, where each of the first layer and a second layer may have a single layer structure or a multi-layer structure, and a density of the fiber in the first layer may be higher than a density of the fiber in the second layer.

In an exemplary embodiment, the density of the fiber in the first layer may be about 2 to about 10 times the density of the fiber in the second layer.

The first layer may have a modulus in a range of about 900 Mpa to about 20000 Mpa, and the second layer may have a modulus in a range of about 0.001 Mpa to about 500 Mpa.

In an exemplary embodiment, the display device may include a folding part which is foldable and a flat part, wherein the portion of the impregnation region including the first and second layers may correspond to at least one of the folding part and the flat part.

In an exemplary embodiment, a portion of the impregnation region may include a first layer facing the window, a third layer facing the display module, and a second layer disposed between the first and third layers, where each of the first, second and third layers may have a single layer structure or a multi-layer structure, and a density of the fiber in each of the first layer and third layers may be lower than a density of the fiber in the second layer.

In an exemplary embodiment, the density of the fiber in each of the first layer and the third layer may be about 0.1 to about 0.9 times the density of the fiber in the second layer.

In an exemplary embodiment, each of the first layer and the third layer may have a modulus in a range of about 0.001 Mpa to about 500 Mpa, and the second layer may have a modulus in a range of about 900 Mpa to about 20000 Mpa.

In an exemplary embodiment, the display device may include a rolling part, which is rollable, and the portion of the impregnation region including the first layer to the third layer may correspond to the rolling part.

In such embodiment, the display module of the display device is effectively protected by the window, and a compression stress that occurs when the display device is bent is substantially reduced by applying various elasticities to parts thereof.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1A:
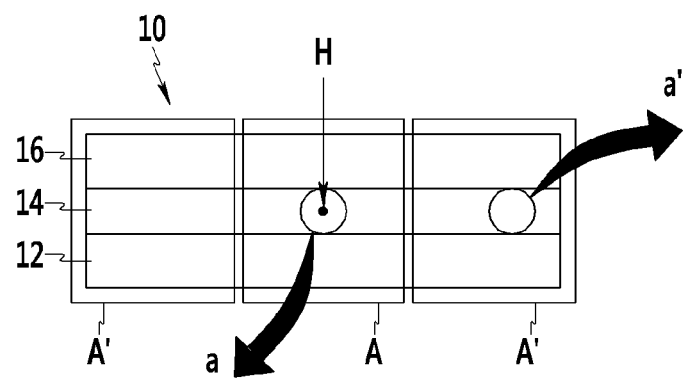
FIG. 1A is a cross-sectional view of an exemplary embodiment of a display device according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Herein, a "folding part" means a part which is deformable, e.g., foldable, that is capable of being folded or bent, along a folding axis (e.g., a center axis in a direction substantially perpendicular to a thickness direction of a display device), and a "flat part" means a part other than "folding part."

An exemplary embodiment of a display device includes a display module, a window disposed on the display module, and an adhesive layer disposed between the display module and the window. In such an embodiment, the adhesive layer includes a pressure sensitive adhesive including an impregnation region impregnated with a fiber. In an exemplary embodiment, a density of the fiber in the adhesive layer is predetermined based on a position thereof in the impregnation region. In such an embodiment, the density of the fiber in the adhesive layer may vary based on, e.g., depending on, a position thereof in the impregnation region or a part of the display device corresponding thereto. In such an embodiment, where the density of the fiber in the adhesive layer varies based on a position thereof in the impregnation region or a part of the display device corresponding thereto, the adhesive layer may apply various elasticity to the parts of the display device, such that the adhesive layer effectively protect a display module and substantially alleviate a compression stress when a display device is bent.

In such an embodiment, the adhesive layer may have a single layer structure.

In an exemplary embodiment, the pressure sensitive adhesive may include a polymer resin in which a fiber is impregnated.

In such an embodiment, the polymer resin may be adhesive, and the fiber may be transparently woven in the polymer, thereby substantially firmly supporting the pressure sensitive adhesive. In such an embodiment, where the pressure sensitive adhesive includes the polymer resin, the pressure sensitive adhesive may be transparent, flexible and adhesive and have high hardness. In an exemplary embodiment, the pressure sensitive adhesive is disposed between a display panel and the window, e.g., beneath the window, such that the pressure sensitive adhesive substantially firmly protect the display panel and effectively secure high hardness of the window, and an appearance deformation of the display device, such as a pushing-down spot and the like, may be effectively prevented.

In an exemplary embodiment, the polymer resin may include an acryl-based resin, an epoxy-based resin, a urethane-based resin, a silicon-based resin or a combination thereof, but not being limited thereto.

In an exemplary embodiment, the fiber may include a glass fiber, a carbon fiber, an aramid-based fiber, a polyester fiber, asbestos, a cellulose-based fiber, or a combination thereof, but not being limited thereto. In an exemplary embodiment, the fiber may include a fabric type of plain fabrics, twilled fabrics, satin weave fabrics, unidirectional fabrics, or a combination thereof, but not being limited thereto.

In an exemplary embodiment, the pressure sensitive adhesive may have a film-like shape. In such an embodiment, the pressure sensitive adhesive may be provided by coating the polymer resin on both sides of the fiber.

In an exemplary embodiment, the density of a fiber impregnated in the adhesive layer may be adjusted by changing a method of weaving the fiber, thickness of a yarn of the fiber, a space woven by the fiber, that is, a space woven by weft and warp threads, and the like.

In an exemplary embodiment, the fiber may be impregnated in an amount in a range of about 10 wt % to about 90 wt % based on total amount of the pressure sensitive adhesive. In one exemplary embodiment, for example, the fiber may be impregnated in an amount in a range of about 30 wt % to about 80 wt % based on the total amount of the pressure sensitive adhesive. In such an embodiment, where the fiber is impregnated in an amount in the range of about 10 wt % to about 90 wt % based on the total amount of the pressure sensitive adhesive, a pressure sensitive adhesive may have high elasticity.

In an exemplary embodiment, the fiber may be impregnated in a single layer or a plurality of layers inside an adhesive layer. In an exemplary embodiment, where the fiber is impregnated in a plurality of layers, a pressure sensitive adhesive may have a substantially high elasticity.

Hereinafter, exemplary embodiments of the display device according to the invention will be described in detail with reference to FIGS. 1A to 8, but the invention is not limited thereto.

Figure 1B:
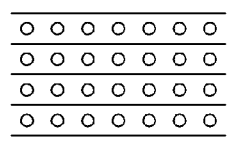
FIGS. 1B and 1C are enlarged cross-sectional views of portions of the adhesive layer shown in FIG. 1A.
Figure 1C:
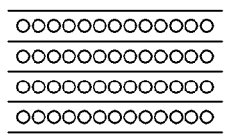

FIG. 1A is a cross-sectional view of an exemplary embodiment of a display device according to the invention, and FIGS. 1B and 1C are enlarged cross-sectional views of portions of the adhesive layer shown in FIG. 1A.

Referring to FIG. 1A, an exemplary embodiment of a display device 10 according to the invention includes a display module 12, a window 16 disposed on the display module 12, and an adhesive layer 14 disposed between the display module 12 and the window 16.

The adhesive layer includes a pressure sensitive adhesive including an impregnation region impregnated with a fiber.

In an exemplary embodiment, as shown in FIGS. 1A to 1C, the impregnation region may include a first impregnation portion a and a second impregnation portion a', and the fiber impregnated in the first impregnation portion a may have a lower density than the fiber impregnated in the second impregnation portion a'. FIG. 1B shows a region having a relatively low impregnation density of the fiber (e.g., the first impregnation portion a), and FIG. 1C shows a region having a relatively high impregnation density of the fiber (e.g., the second impregnation portion a').

In such an embodiment, a density of the fiber impregnated in the first impregnation portion may be about 0.1 to about 0.9 times the density of the fiber in the second impregnation portion a'. In one exemplary embodiment for, example, the density of the fiber in the first impregnation portion a may be about 0.2 to about 0.8 times the density of the fiber in the second impregnation portion a'.

The first impregnation portion a may have a modulus in a range of about 0.001 megapascal (Mpa) to about 500 megapascals (Mpa), and the second impregnation portion a' may have a modulus in a range of about 900 Mpa to about 20,000 Mpa. In one exemplary embodiment, for example, the first impregnation portion a may have a modulus in a range of about 1 Mpa to about 100 Mpa, and the second impregnation portion a' may have an elastic modulus in a range of about 1,000 Mpa to about 15,000 Mpa.

In such an embodiment, the second impregnation portion a' has a relatively high fiber density and high elasticity, such that the second impregnation portion a' may be substantially firm and thereby effectively protect the window and the display module disposed thereon and thereunder. In such an embodiment, the first impregnation portion a has a relatively low fiber density and a low elasticity such that the first impregnation portion a may be relatively flexible and effectively alleviate a compression stress of the window when the display device is deformed, e.g., bent.

According to an exemplary embodiment, the display device may be a foldable display device including a folding part A, which is foldable, that is, may be substantially folded or bent with respect to a folding axis H, e.g., in a direction substantially perpendicular to a thickness direction of the display device, and a flat part A' which is not substantially folded or bent, as shown in FIG. 1A. In such an embodiment, where the display device is the foldable display device, the first impregnation portion a may correspond to the folding part A, and the second impregnation portion a' may correspond to the flat part A'. In such an embodiment, the display device has high surface hardness and elasticity in the flat part A' such that the display module disposed in a lower portion thereof and the window disposed in an upper portion thereof may be effectively protected, and has a low elasticity in the folding part A such that a compression stress of the upper window is effectively alleviated.

Figure 2:
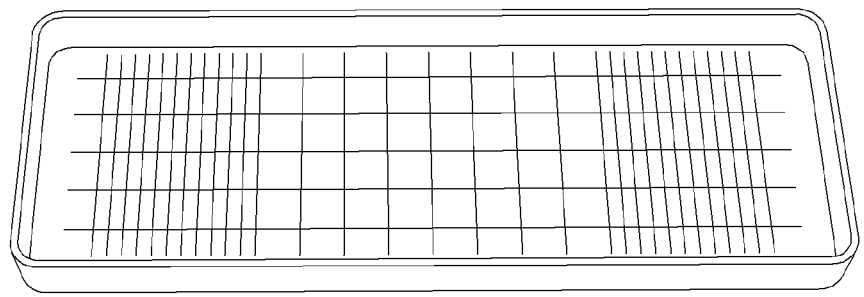
FIG. 2 is a perspective view of a pressure sensitive adhesive of the adhesive layer of the display device shown in FIG. 1A.

FIG. 2 is a top perspective view of a pressure sensitive adhesive of the adhesive layer 14 in FIG. 1.

As shown in FIG. 2, an exemplary embodiment of the pressure sensitive adhesive may be impregnated with a fiber, and the density of the fiber varies based on a position thereof in the impregnation region or a part of the display device corresponding thereto.

Figure 3A:
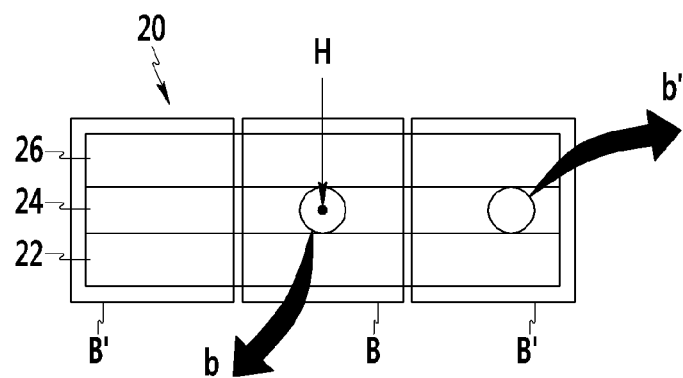
FIG. 3A is a cross-sectional view of an alternative exemplary embodiment of a display device according to the invention.
Figure 3B:
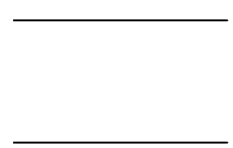
FIGS. 3B and 3C are enlarged cross-sectional views of portions of the adhesive layer shown in FIG. 3A.
Figure 3C:
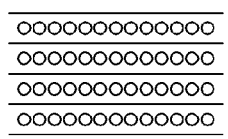

FIG. 3A is a cross-sectional view of an alternative exemplary embodiment of a display device according to the invention, and FIGS. 3B and 3C are enlarged cross-sectional views of the adhesive layer shown in FIG. 3A.

Referring to FIG. 3A, an exemplary embodiment of a display device includes a display module 22, a window 26 disposed on the display module 22, and an adhesive layer 24 disposed between the display module 22 and the window 26.

In such an embodiment, the adhesive layer includes a pressure sensitive adhesive including an impregnation region impregnated with a fiber. In such an embodiment, as shown in FIGS. 3A to 3C, the pressure sensitive adhesive may include a non-impregnation region b which is not impregnated with a fiber, and an impregnation region b', which is impregnated with a fiber.

FIGS. 3B and 3C respectively show the non-impregnation region b, which is not impregnated with a fiber, and the impregnation region b', which is impregnated with a fiber in a high density.

The impregnation region b' may have a modulus of about 900 Mpa to about 20,000 Mpa, and the non-impregnation region b may have a modulus in a range of about 0.001 Mpa to about 500 Mpa. In one exemplary embodiment, for example, the impregnation region b' may have a modulus of about 1,000 Mpa to about 15,000 Mpa, and the non-impregnation region b may have a modulus in a range of about 1 Mpa to about 100 Mpa.

In such an embodiment, the impregnation region b' has high fiber density and high elasticity, such that the impregnation region b' may be firm and thereby effectively protect the window and the display module disposed thereon and thereunder. In such an embodiment, the non-impregnation region b is not impregnated with a fiber such that the non-impregnation region b is flexible, may allow a distance between upper window and lower display module to decrease and thereby effectively alleviates a compression stress of the window, when the display device is deformed, e.g., bent.

According to an exemplary embodiment, the display device may be a foldable display device including a folding part B, which may be folded or bent along a folding axis H defined therein, e.g., in a direction substantially perpendicular to a thickness direction of the display device, and a flat part B' which is not substantially folded or bent, as shown in FIG. 3. In such an embodiment, where the display device is the foldable display device, the non-impregnation region b may correspond to the folding part B, and the impregnation region b' may correspond to the flat part B'. In such an embodiment, the display device has high surface hardness and high elasticity in the flat part B' such that the display module disposed in a lower portion thereof and the window disposed in an upper portion thereof may be effectively protected, and has a low elasticity in the folding part B such that a compression stress of the upper window is effectively alleviated.

Figure 4:
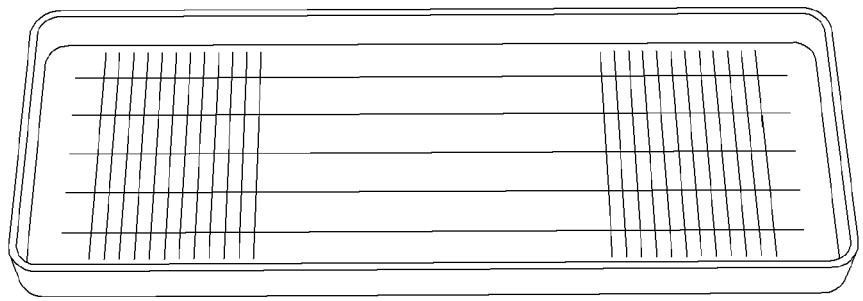
FIG. 4 is a top perspective view of a pressure sensitive adhesive of the adhesive layer in FIG. 3A.

FIG. 4 is a top perspective view of a pressure sensitive adhesive of the adhesive layer 24 in FIG. 3.

Referring to FIG. 4, the pressure sensitive adhesive is impregnated with a fiber, and the density of the fiber varies based on a position thereof in the impregnation region or a part of the display device corresponding thereto.

Figure 5A:
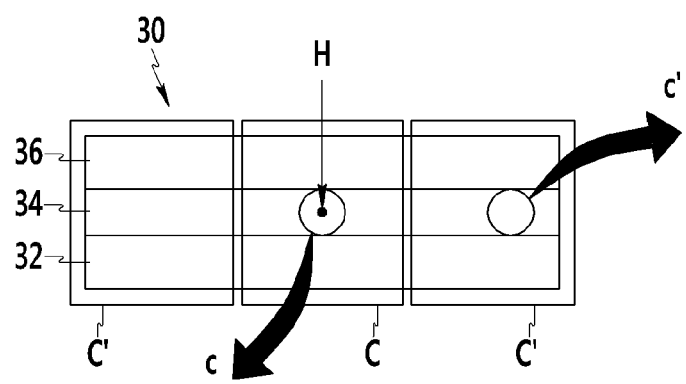
FIG. 5A is a cross-sectional view of another alternative exemplary embodiment of a display device according to the invention.
Figure 5B:
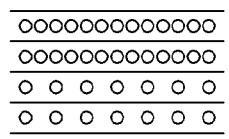
FIGS. 5B and 5C are enlarged cross-sectional views of portions of the adhesive layer shown in FIG. 5A.
Figure 5C:
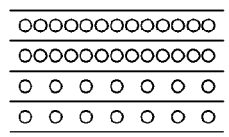

FIG. 5A is a cross-sectional view of another alternative exemplary embodiment of a display device according to the invention, and FIGS. 5B and 5C are enlarged cross-sectional views of portions of the adhesive layer shown in FIG. 5A.

Referring to FIG. 5A, an exemplary embodiment of a display device 30 includes a display module 32, a window 36 disposed on the display module 32, and an adhesive layer 34 disposed between the display module 32 and the window 36.

The adhesive layer includes a pressure sensitive adhesive including an impregnation region impregnated with a fiber.

In such an embodiment, as shown in FIGS. 5B and 5C, the impregnation region may include a first layer facing the window, and a second layer facing the display module. In such an embodiment, each of the first and second layers of the impregnation region may have a single layer structure or a multi-layer structure. In such an embodiment, a density of the fiber in the first layer may be different from a density of the fiber in the second layer. In one exemplary embodiment, for example, the density of the fiber in the first layer may be higher than the density of the fiber in the second layer.

Hereinafter, for convenience of description, an exemplary embodiment, where the density of the fiber in the first layer is higher than the density of the fiber in the second layer, will be described with reference to FIGS. 5B and 5C.

As shown in FIGS. 5B and 5C, the impregnation region may include a plurality of portions c and c', each including the first impregnation portion and the second impregnation portion. In such an embodiment, as shown in FIGS. 5B and 5C, the each portion c and c' of the impregnation region includes the first layer and the second layer. In such an embodiment, the density of fiber in the first layer is relatively high, and the density of fiber in the second layer is relatively low.

In an exemplary embodiment, the density of fiber in the first layer may be about 2 to about 10 times the density of fiber in the second layer. In one exemplary embodiment, for example, the density of fiber in the first layer may be about 2 to about 5 times the density of fiber in the second layer.

In an exemplary embodiment, the first layer may have a modulus in a range of about 900 Mpa to about 20,000 Mpa, and the second layer may have a modulus in a range of about 0.001 Mpa to about 500 Mpa. In one exemplary embodiment, for example, the first layer may have a modulus in a range of about 1,000 Mpa to about 15,000 Mpa, and the second layer may have a modulus in a range of about 1 Mpa to about 100 Mpa.

In such an embodiment, the first layer in the impregnation region has a relatively high fiber density and a high elasticity, such that the first layer may be firm, and the second layer has a relatively low fiber density and a low elasticity such that the second layer may be flexible. In such an embodiment, where the adhesive layer has an impregnation structure including the first layer and the second layer, the adhesive layer may effectively protect the window and the display module disposed thereon and thereunder, and may effectively alleviate a compression stress when the display device is bent.

According to an exemplary embodiment, the display device may be a foldable display device including a folding part C, which foldable along a folding axis H defined therein, e.g., in a direction substantially perpendicular to a thickness direction of the display device, and a flat part C' which is not substantially folded or bent, as shown in FIG. 5A. In such an embodiment, where the display device is the foldable display device, the impregnation region including the first layer and the second layer may be divided into a plurality of portions corresponding to the folding part C and the flat part C'. In such an embodiment, a density of the fiber in the first layer of a portion of the impregnation region corresponding to the folding part C may be less than a density of the fiber in the first layer of the portion of the impregnation region corresponding to the flat part C', and a density of the fiber in the second layer of the portion of the impregnation region corresponding to the folding part C may be may be less than a density of the fiber in the second layer of the portion the impregnation region corresponding to the flat part C'. In such an embodiment, the display device has a relatively high surface hardness and elasticity in the flat part A' such that the display module disposed in a lower portion thereof and the window disposed in an upper portion thereof may be effectively protected, and has a relatively low elasticity in the folding part A such that a compression stress of the upper window is effectively alleviated.

Figure 6:
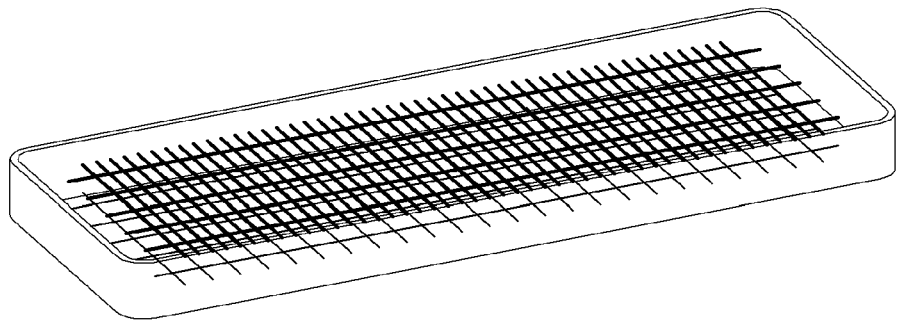
FIG. 6 is a top perspective view of a pressure sensitive adhesive of the adhesive layer of the display device shown in FIG. 5A.

FIG. 6 is a top perspective view of a pressure sensitive adhesive consisting of the adhesive layer 34 in FIG. 5A.

Referring to FIG. 6, the pressure sensitive adhesive is impregnated with a fiber, and the density of the fiber varies based on a position thereof in the impregnation region or a part of the display device corresponding thereto.

Figure 7A:
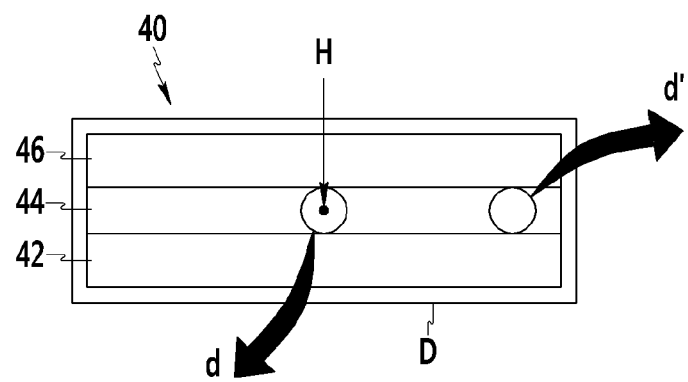
FIG. 7A is a cross-sectional view of another alternative exemplary embodiment of a display device according to the invention.
Figure 7B:
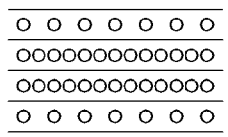
FIGS. 7B and 7C are enlarged cross-sectional views of portions of the adhesive layer shown in FIG. 7A.
Figure 7C:
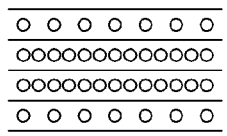

FIG. 7A is a cross-sectional view of another alternative exemplary embodiment of a display device according to the invention, and FIGS. 7B and 7C are enlarged cross-sectional views of portions of the adhesive layer shown in FIG. 7A.

Referring to FIG. 7A, an exemplary embodiment of a display device 40 may include a display module 42, a window 46 on the display module 42, and an adhesive layer 44 disposed between the display module 42 and the window 46.

The adhesive layer includes a pressure sensitive adhesive including an impregnation region impregnated with a fiber.

In such an embodiment, the impregnation region may include a first layer facing the window, a third layer facing the display module, and a second layer disposed between the first and third layers. In such an embodiment, each of the first, second and third layers of the impregnation region may have a single layer structure or a multi-layer structure. In such an embodiment, a density of the fiber in the first and third layer may be different from a density of the fiber in the second layer. In one exemplary embodiment, for example, a density of the fiber in the first and third layer may be lower than a density of the fiber in the second layer.

In an exemplary embodiment, as shown in FIGS. 7B and 7C, the impregnation region may include a plurality of portions d and d', each including the first impregnation portion n and the second impregnation portion. In such an embodiment, as shown in FIGS. 7B and 7C, each portion d and d' of the impregnation region includes the first layer to the third layer. In such an embodiment, the density of fiber in the first layer and the third layer is relatively low, and the density of fiber in the second layer may be relatively high.

In an exemplary embodiment, the density of fiber in in the first layer and the third layer impregnation may be about 0.1 to about 0.9 times the density of fiber in the second layer. In one exemplary embodiment, for example, and the density of fiber in in the first layer and the third layer impregnation may be about 0.2 to about 0.8 times the density of fiber in the second layer.

In an exemplary embodiment, each of the first layer and the third layer may have a modulus in a range of about 0.001 Mpa to about 500 Mpa, and the second layer may have a modulus in a range of about 900 Mpa to about 20,000 Mpa. In one exemplary embodiment, for example, each of the first layer and the third layer may have a modulus in a range of about 1 to about 100 Mpa, and the second layer may have a modulus in a range of about 1,000 Mpa to about 15,000 Mpa.

In such an embodiment, the first layer and the third layer in the impregnation region have a relatively low fiber density and a low elasticity such that the first layer and the third layer may be flexible, and the second layer has a relatively low high fiber density and a high elasticity such that the second layer may be firm. In such an embodiment, where the adhesive layer has an impregnation structure including the first layer to the third layer s, the adhesive layer may effectively protect the window and the display module dispose thereon and thereunder, and effectively alleviate a compression stress of the window when a display device is bent. Accordingly, an elasticity of the display device may be optimized, and a rolling stress may be alleviated when the display device is deformed, e.g., folded or bent.

According to an exemplary embodiment, the display device may be a roller type display device including a rolling part which is rollable, that is, may be rolled along a rolling axis (H) disposed therein, e.g., in a center thereof, as shown in FIG. 7A. In such an embodiment, where the display device is the roller-type display device, an impregnation region including the first layer to the third layer may be the part. Accordingly, an elasticity of the display device may be optimized, and a rolling stress may be alleviated when the display device is deformed, e.g., folded or bent.

Figure 8:
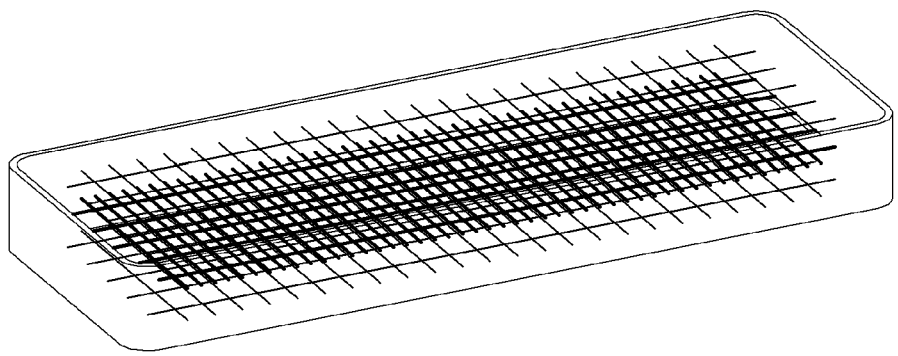
FIG. 8 is a top perspective view of a pressure sensitive adhesive of the adhesive layer of the display device shown in FIG. 7A.

FIG. 8 is a top perspective view of a pressure sensitive adhesive consisting of the adhesive layer 44 in FIG. 7A.

Referring to FIG. 8, the pressure sensitive adhesive is impregnated with a fiber, and the density of the fiber varies based on a position thereof in the impregnation region or a part of the display device corresponding thereto.

The invention should not be construed as being limited to the exemplary embodiments set forth herein. Rather, these exemplary embodiments are provided so that this disclosure will be thorough and complete and will fully convey the concept of the present invention to those skilled in the art. Accordingly, in another alternative exemplary embodiment, a density of a fiber in the impregnation region may be variously adjusted to have a density difference based on a position thereof in the impregnation region or a part of the display device corresponding thereto.

An exemplary embodiment of a display device includes a liquid crystal display ("LCD"), an organic light emitting diode ("OLED") display, a plasma display, an electric field effect display device, an electrophoretic display, or the like, but not being limited thereto.

In an exemplary embodiment, a display module disposed under the above-described adhesive layer may be a liquid crystal display module, an organic light emitting display module, a plasma display module, an electric field effect display module, an electrophoresis display module, or the like, but not being limited thereto.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising
a display module which displays an image;
a window disposed on the display module, wherein the window defines an outermost surface of the display device; and
an adhesive layer disposed between the display module and the window,
wherein
the adhesive layer comprises a pressure sensitive adhesive comprising an impregnation region impregnated with a fiber,
a density of the fiber in the adhesive layer is predetermined based on a position thereof in the impregnation region or a part of the display device corresponding thereto,
the display device comprises a folding part which is foldable, and a flat part,
the impregnation region comprises:
a first impregnation portion disposed in the folding part and outside the flat part; and
a second impregnation portion disposed in the flat part and outside the folding part, and
a density of the fiber in the first impregnation portion is lower than a density of the fiber in the second impregnation portion.

2. The display device of claim 1, wherein the adhesive layer has a single layer structure.

3. The display device of claim 1, wherein the fiber comprises a glass fiber, a carbon fiber, an aramid-based fiber, a polyester fiber, asbestos, a cellulose-based fiber, or a combination thereof, and wherein the fiber has a fabric type of plain fabrics, twilled fabrics, satin weave fabrics, unidirectional fabrics, or a combination thereof.

4. The display device of claim 1, wherein an amount of the fiber in the pressure sensitive adhesive is in a range of about 10 wt % to about 90 wt % based on a total amount of the pressure sensitive adhesive.

5. The display device of claim 1, wherein
the density of the fiber in the first impregnation portion is about 0.1 to about 0.9 times the density of the fiber in the second impregnation portion.

6. The display device of claim 1, wherein
the first impregnation portion has a modulus in a range of about 0.001 megapascal to about 500 megapascals, and
the second impregnation portion has a modulus in a range about 900 megapascals to about 20,000 megapascals.

7. The display device of claim 1, wherein
the pressure sensitive adhesive further comprises a non-impregnation region, which is not impregnated with the fiber.

8. The display device of claim 7, wherein
the impregnation region has a modulus in a range of about 900 megapascals to about 20,000 megapascals, and
the non-impregnation region has a modulus in a range of about 0.001 megapascal to about 500 megapascals.

9. The display device of claim 7, further comprising:
a folding part which is foldable; and
a flat part,
wherein the non-impregnation region corresponds to the folding part, and the impregnation region corresponds to the flat part.

10. The display device of claim 1, wherein the impregnation region comprises a plurality of layers.

11. A display device, comprising
a display module which displays an image;
a window disposed on the display module, wherein the window defines an outermost surface of the display device; and
an adhesive layer disposed between the display module and the window,
wherein
the adhesive layer comprises a pressure sensitive adhesive comprising an impregnation region impregnated with a fiber,
a density of the fiber in the adhesive layer is predetermined based on a position thereof in the impregnation region or a part of the display device corresponding thereto,
wherein a portion of the impregnation region comprises:
a first layer facing the window; and
a second layer facing the display module,
each of the first layer and a second layer has a single layer structure, or a multi-layer structure, and
a density of the fiber in the first layer is higher than a density of the fiber in the second layer.

12. The display device of claim 11, wherein
the density of the fiber in the first layer is about 2 to about 10 times the density of the fiber in the second layer.

13. The display device of claim 11, wherein
the first layer has a modulus in a range of about 900 megapascals to about 20,000 megapascals, and
the second layer has a modulus in a range of about 0.001 megapascal to about 500 megapascals.

14. The display device of claim 11, further comprising:
a folding part which is foldable; and
a flat part,
wherein the portion of the impregnation region comprising the first layer and the second layer corresponds to at least one of the folding part and the flat part.

15. A display device, comprising
a display module;
a window disposed on the display module, wherein the window defines an outermost surface of the display device; and
an adhesive layer disposed between the display module and the window,
wherein
the adhesive layer comprises a pressure sensitive adhesive comprising an impregnation region impregnated with a fiber,
a density of the fiber in the adhesive layer is predetermined based on a position thereof in the impregnation region or a part of the display device corresponding thereto,
wherein a portion of the impregnation region comprises:
a first layer facing the window;
a third layer facing the display module; and
a second layer disposed between the first and third layers,
wherein
each of the first, second and third layers has a single layer structure or a multi-layer structure, and
a density of the fiber in each of the first layer and third layers is lower than a density of the fiber in the second layer.

16. The display device of claim 15, wherein
the density of the fiber in each of the first layer and the third layer is about 0.1 to about 0.9 times the density of the fiber in the second layer.

17. The display device of claim 15, wherein
each of the first layer and the third layer has a modulus in a range of about 0.001 megapascal to about 500 megapascals, and
the second layer has a modulus in a range of about 900 megapascals to about 20,000 megapascals.

18. The display device of claim 15, further comprising:
a rolling part which is rollable,
wherein the portion of the impregnation region comprising the first layer to the third layer corresponds to the rolling part.

* * * * *